(12) United States Patent
Lüchinger et al.

(10) Patent No.: US 12,018,191 B2
(45) Date of Patent: Jun. 25, 2024

(54) MODIFIED LUMINESCENT COMPONENT

(71) Applicant: Avantama AG, Stäfa (CH)

(72) Inventors: Norman Albert Lüchinger, Stäfa (CH); Marek Oszajca, Stäfa (CH); Stefan Loher, Stäfa (CH); Victoria Blair, Stäfa (CH); Karin Fleischmann, Stäfa (CH)

(73) Assignee: Avantama AG, Stäfa (CH)

( * ) Notice: Subject to any disclaimer, the term of this patent is extended or adjusted under 35 U.S.C. 154(b) by 5 days.

(21) Appl. No.: 17/744,729

(22) Filed: May 16, 2022

(65) Prior Publication Data

US 2022/0411693 A1  Dec. 29, 2022

(30) Foreign Application Priority Data

Jun. 9, 2021  (EP) .................................. 21178560

(51) Int. Cl.
*C09K 11/02* (2006.01)
*C09K 11/00* (2006.01)
(Continued)

(52) U.S. Cl.
CPC ............ *C09K 11/025* (2013.01); *C09K 11/00* (2013.01); *C09K 11/66* (2013.01)

(58) Field of Classification Search
CPC ....... C09K 11/06; C09K 11/025; C09K 11/02; C09K 11/66; C09K 11/665; C09K 11/664;
(Continued)

(56) References Cited

U.S. PATENT DOCUMENTS 11,008,508 B2 * 5/2021 Lüchinger ............ C09K 11/664
11,708,528 B2 * 7/2023 Lüchinger .............. C01G 19/00
362/97.1
(Continued)

FOREIGN PATENT DOCUMENTS

EP 3339394 A1 6/2018
WO 2016124555 A1 8/2016
(Continued)

OTHER PUBLICATIONS

Guangru Li et al., "Efficient Light-Emitting Diodes Based on Nanocrystalline Perovskite in a Delectric Polymer Matrix", American Chemical Society, Nano Lett. 2015, 15, 2640-2644.
(Continued)

*Primary Examiner* — Matthew E. Hoban
*Assistant Examiner* — Lynne Edmondson
(74) *Attorney, Agent, or Firm* — Renner, Otto, Boisselle & Sklar, LLP

(57) ABSTRACT

Described are luminescent components with excellent performance and stability. The luminescent components comprise a solid material composition comprising luminescent crystals 11 from the class of perovskite crystals, embedded in a solid matrix 14 comprising a polymer P1 or Small Molecules SM1 and metal selected from Mg, Sr, Ba, Sc, Y, Zn, Cd, In, and Sb. Further described are components and devices comprising the same. Also described are methods for manufacturing such components and devices comprising such components and liquid compositions useful for such manufacturing.

17 Claims, 1 Drawing Sheet

(51) Int. Cl.
   *C09K 11/06* (2006.01)
   *C09K 11/66* (2006.01)
   *C09K 11/74* (2006.01)
   *H01L 33/50* (2010.01)

(58) Field of Classification Search
   CPC . C09K 11/74; C09K 11/7414; C09K 11/7421; C09K 11/7428; C09K 11/75; C09K 2211/188; H01L 33/501; H01L 33/502; H01L 33/505; H01L 33/507; H01L 27/156; H01L 27/153; H10K 50/115; H10K 50/805
   See application file for complete search history.

(56) References Cited

U.S. PATENT DOCUMENTS

| | | |
|---|---|---|
| 2017/0342316 A1 | 11/2017 | Luther et al. |
| 2022/0002618 A1 | 1/2022 | Li et al. |

FOREIGN PATENT DOCUMENTS

| | | |
|---|---|---|
| WO | 2020244046 A1 | 12/2020 |
| WO | 2020254236 A1 | 12/2020 |

OTHER PUBLICATIONS

M. Nikl et al., "Luminescense of CsPbBr3-like quantum dots in CsBr single crystals", Physica E 4 (1999) 323-331.

\* cited by examiner

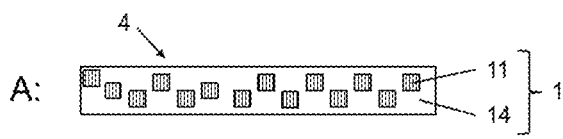
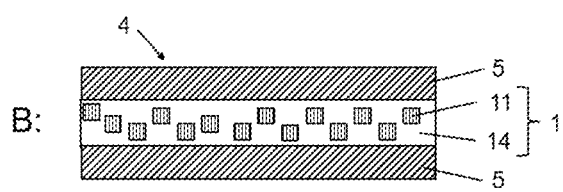
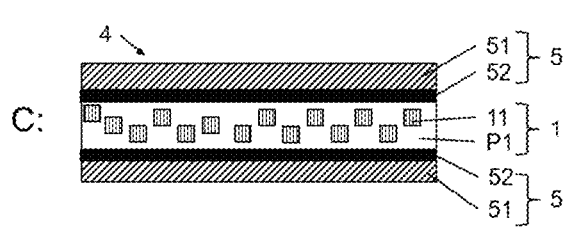
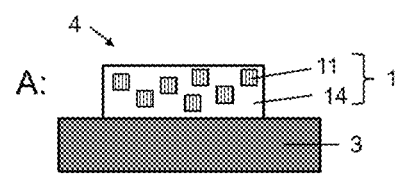
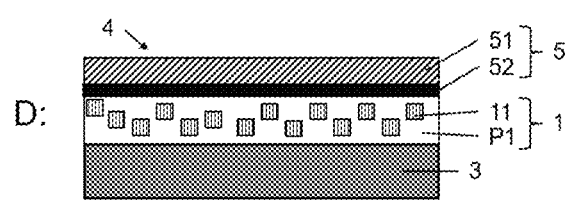
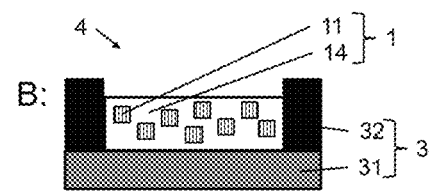
Fig. 1
Fig. 2

MODIFIED LUMINESCENT COMPONENT

This application claims priority of European Patent Application No. 21178560.5 filed Jun. 9, 2021, which is hereby incorporated herein by reference in its entirety.

TECHNICAL FIELD

The present invention relates to the field of luminescent crystals (LCs), components and devices comprising the same. Particularly, the invention provides a luminescent component, light emitting devices comprising such components, the use of a luminescent component, the use of specific metals in such components and methods for manufacturing liquid compositions comprising LCs such metals, for manufacturing luminescent components and for manufacturing light emitting devices. These luminescent components show excellent performance and stability.

BACKGROUND ART

WO2020/254236 discloses luminescent components comprising perovskite crystals and embedded in a first polymer which is encapsulated by a second polymer. The luminescent components are suited for advanced applications in light emitting devices, they show excellent performance and stability. Although suited, it is considered disadvantageous that the devises show high content on heavy metals, such as Pb.

There is an ever existing need to provide alternative components and devices. Specifically there is a need to provide components and devices with reduced heavy metal content, particularly for such components and devices that at the same time retain the performance an stability of known components and devices. The present invention addresses such need.

Disclosure of the Invention

Luminescent components, particularly comprising LCs of the perovskite structure, are known and used in lighting devices. Although suitable for many applications, it was found that these luminescent components and lighting devices lack stability, particularly in view of high temperature and high humidity and blue light irradiation. Further, the comparatively high concentration of heavy metals is considered disadvantageous. Attempts to mitigate these shortcomings are only partly successful, as they result in difficult manufacturing and/or expensive additional components, rendering them unsuitable for large scale production.

Thus, it is an object of the present invention to mitigate at least some of these drawbacks of the state of the art. In particular, it is an aim of the present invention to provide improved luminescent components that are highly luminescent and at the same time show improved stability, particularly towards temperature and humidity and blue light radiation. It is a further aim to provide new lighting devices and manufacturing methods for such components and devices, particularly manufacturing methods suited for commercial production.

These objectives are achieved by a luminescent component (4), lighting devices, liquid compositions ("inks"), and manufacturing methods as described herein. Further aspects of the invention are disclosed in the specification and independent claims, preferred embodiments are disclosed in the specification and the dependent claims. The invention particularly provides for:

luminescent components and its uses ($1^{st}$ aspect);
light emitting devices comprising such components ($2^{nd}$ aspect);
liquid compositions which are suitable for the manufacturing of luminescent components ($3^{rd}$ aspect); and
manufacturing methods of liquid compositions, luminescent components and devices ($4^{th}$ aspect).

The present invention will be described in detail below. It is understood that the various embodiments, preferences and ranges as provided/disclosed in this specification may be combined at will. Further, depending of the specific embodiment, selected definitions, embodiments or ranges may not apply.

Unless otherwise stated, the following definitions shall apply in this specification:

The terms "a", "an" "the" and similar terms used in the context of the present invention are to be construed to cover both the singular and plural unless otherwise indicated herein or clearly contradicted by the context. The term "containing" shall include all, "comprising", "essentially consisting of" and "consisting of". Percentages are given as weight-%, unless otherwise indicated herein or clearly contradicted by the context. "Independently" means that one substituent/ion may be selected from one of the named substituents/ions or may be a combination of more than one of the above.

The term "luminescent crystal" (LC) is known in the field and relates to crystals of 3-100 nm, made of semiconductor materials (determined according by TEM, volume weighted average). The term comprises quantum dots, typically in the range of 3-15 nm and nanocrystals, typically in the range of more than 15 nm and up to 100 nm (preferably up to 50 nm). Preferably, luminescent crystals are approximately isometric (such as spherical or cubic). Particles are considered approximately isometric, in case the aspect ratio (longest: shortest direction) of all 3 orthogonal dimensions is 1-2. Accordingly, an assembly of LCs preferably contains 50-100% (n/n), preferably 66-100% (n/n) much preferably 75-100% (n/n) isometric nanocrystals.

LCs show, as the term indicates, luminescence. In the context of the present invention the term luminescent crystal includes both, single crystals and polycrystalline particles. In the latter case, one particle may be composed of several crystal domains (grains), connected by crystalline or amorphous phase boundaries. A luminescent crystal is a semi-conducting material which exhibits a direct bandgap (typically in the range 1.1-3.8 eV, more typically 1.4 3.5 eV, even more typically 1.7-3.2 eV). Upon illumination with electromagnetic radiation equal or higher than the bandgap, the valence band electron is excited to the conduction band leaving an electron hole in the valence band. The formed exciton (electron-electron hole pair) then radiatively recombines in the form of photoluminescence, with maximum intensity centered around the LC bandgap value and exhibiting photoluminescence quantum yield of at least 1%. In contact with external electron and electron hole sources LC could exhibit electroluminescence. In the context of the present invention LCs do not exhibit mechanoluminescence (e.g. piezoluminescence), chemiluminescence nor thermoluminescence.

The term "quantum dot" (QD) is known and particularly relates to semiconductor nanocrystals, which have a diameter typically between 3-15 nm. In this range, the physical radius of the QD is smaller than the bulk excitation Bohr radius, causing quantum confinement effect to predominate. As a result, the electronic states of the QD, and therefore the bandgap, are a function of the QD composition and physical size, i.e. the color of absorption/emission is linked with the QD size. The optical quality of the QDs sample is directly linked with their homogeneity (more monodisperse QDs will have smaller FWHM of the emission). When QD reach size bigger than the Bohr radius the quantum confinement effect is hindered and the sample may not be luminescent anymore as nonradiative pathways for exciton recombination may become dominant. Thus, QDs are a specific subgroup of nanocrystals, defined in particular by its size and size distribution.

The term "perovskite crystals" is known and particularly includes crystalline compounds of the perovskite structure. Such perovskite structures are known per se and described as cubic, pseudocubic, tetragonal or orthorhombic crystals of general formula $M^1M^2X_3$, where $M^1$ are cations of coordination number 12 (cuboctaeder) and $M^2$ are cations of coordination number 6 (octaeder) and X are anions in cubic, pseudocubic, tetragonal or orthorhombic positions of the lattice. In these structures, selected cations or anions may be replaced by other ions (stochastic or regularly up to 30 atom-%), thereby resulting in doped perovskites or non-stochiometric perovskites, still maintaining its original crystalline structure. The manufacturing of such luminescent crystals is known, e.g. from WO2018/028869.

The term "matrix" is known in the field and in the context of this invention denotes continuous phase encompassing a discontinuous or particulate phase. The particulate phase is distributed within, typically homogeneously distributed within, the continuous phase. Suitable matrix materials are known in the field, and are typically non-absorbing and transparent. Suitable matrix materials may be selected from "polymers" and "small molecules" as defined herein.

The term "polymer" is known and includes organic and inorganic synthetic materials comprising repeating units ("monomers"). Depending on the context, the term polymer shall include its monomers and oligomers. Organic Polymers include, by way of example, acrylate polymers, carbonate polymers, sulfone polymers, epoxy polymers, vinyl polymers, urethane polymers, imide polymers, ester polymers, furane polymers, melamine polymers, styrene polymers, norbornene polymers, and cyclic olefin copolymers. Inorganic polymers include, by way of example, silicone polymers or polysilazane polymers. Silicone polymers are considered inorganic due to the polymer forming —O—Si— motif, even if containing organic side chains. The term polymers includes homo-polymers and co-polymers. Further, cross-linked polymers and non-cross-linked polymers are included. Polymers may include, as conventional in the field, other materials such as polymerization initiators, stabilizers, fillers, solvents.

Polymers may be further characterized by physical parameters, such as polarity, glass transition temperature Tg, Young's modulus and light transmittance.

Transmittance: Typically, polymers used in the context of this invention are light transmissive for visible light, i.e. non-opaque for allowing light emitted by the luminescent crystals, and possible light of a light source used for exciting the luminescent crystals to pass. Light transmittance may be determined by white light interferometry or UV-Vis spectrometry.

Glass transition temperature: (Tg) is a well-established parameter in the field of polymers; it describes the temperature where an amorphous or semi-crystalline polymer changes from a glassy (hard) state to a more pliable, compliant or rubbery state. Polymers with high Tg are considered "hard", while polymers with low Tg are considered "soft". On a molecular level, Tg is not a discrete thermodynamic transition, but a temperature range over which the mobility of the polymer chains increase significantly. The convention, however, is to report a single temperature defined as the midpoint of the temperature range, bounded by the tangents to the two flat regions of the heat flow curve of the DSC measurement. Tg may be determined according to DIN EN ISO 11357-2 or ASTM E1356 using DSC. This method is particularly suitable if the polymer is present in the form of bulk material. Alternatively, Tg may be determined by measuring temperature-dependent micro- or nanohardness with micro- or nanoindentation according to ISO 14577-1 or ASTM E2546-15. This method is suited for luminescent components and lighting devices as disclosed herein. Suitable analytical equipment is available as MHT (Anton Paar), Hysitron TI Premier (Bruker) or Nano Indenter G200 (Keysight Technologies). Data obtained by temperature controlled micro- and nanoindentation can be converted to Tg. Typically, the plastic deformation work or Young's modulus or hardness is measured as a function of temperature and Tg is the temperature where these parameters change significantly.

Young's modulus or Young modulus or Elasticity modulus is a mechanical property that measures the stiffness of a solid material. It defines the relationship between stress (force per unit area) and strain (proportional deformation) in a material in the linear elasticity regime of a uniaxial deformation.

The term "small molecule" is known and includes organic and inorganic synthetic materials other than "monomers" and "polymers". Thus, "small molecules" particularly includes organic molecules and polysiloxanes or polysilazanes that are suitable as a matrix material. Small molecules may be selected from the group of semiconducting materials.

The term "solvent" is known in the field and particularly includes aliphatic hydrocarbons, aromatic hydrocarbons, ethers (including glycol-ethers), esters, alcohols, ketones, amines, amides, sulfones, phosphines, alkylcarbonates. The above organics can be substituted or unsubstituted by one or more substituents, for example by halogen (such as fluoro, chloro, iodo or bromo), Hydroxy, C1-4 alkoxy (such as methoxy or ethoxy) and alkyl (such as methyl, ethyl, iso-propyl). The above organics include linear, branched and cyclic derivatives. There can also be unsaturated bonds in the molecule. The above compounds typically have 4-24 carbon atoms, preferably 8-22 carbon atoms, most preferably 12-20 carbon atoms.

The terms "surfactant", "ligand", "dispersant" and "dispersing agent" are known in the field and have essentially the same meaning. In the context of the present invention, these terms denote an organic substance which is used in suspensions or colloids to improve the separation of particles and to prevent agglomeration or settling. Without being bound to theory, it is believed that surfactants are physically or chemically attached on the particle surface either before or after adding the particles to the solvent and thereby provide the desired effects. Surfactants typically contain polar functional end-groups and apolar end-groups. In the context of the present invention, solvents (e.g. toluene), monomers and polymers (e.g. acrylates) are not considered surfactants.

The term "suspension" is known and relates to a heterogeneous fluid of an internal phase (i.p.) that is a solid and an external phase (e.p.) that is a liquid. The external phase comprises one or more surfactants, optionally one or more solvents optionally one or more polymers, pre-polymers or small molecules, and optionally one or more metals $M^3$ in the form of a metal salt or metal complex. The internal phase comprises, typically consists of, perovskite crystals.

The term "solution-processing" is known in the field and denotes the application of a coating or thin film to a substrate by the use of a solution-based (=liquid) starting material. In the context of the present invention, solution processing relates to the fabrication of commercial products, such as electronic devices, optical devices, and lighting devices and also to the fabrication of components/intermediate goods comprising a LC composite or LC layer. Typically, the application of the suspension(s) (also termed "inks") is/are conducted at ambient conditions.

DESCRIPTION OF THE DRAWINGS

Embodiments, examples, experiments representing or leading to embodiments, aspects and advantages of the invention will be better understood from the following detailed description thereof. Such description makes reference to the annexed drawings, wherein:

FIGS. 1A-D illustrate a schematic views of a luminescent component (4) in sheet-like form according to embodiments of the present invention, such components are particularly suitable for display devices.
- A: First luminescent crystals (11) in a matrix (14); no additional barrier;
- B: transparent single layer barrier ((5), with no substructure) on both sides of the component (4);
- C: transparent multi-layer barrier (with substructure (51, 52))
- D: First luminescent crystals (11) in a matrix (14); on a substrate (3) having a barrier (5).

FIGS. 2A-B illustrate schematic views of a luminescent component (4) in the form of a pixel according to embodiments of the present invention.
- A: component with a flat substrate (3), particularly suitable for lighting devices;
- B: component with a structured substrate (31, 32), particularly suited for displays.

REFERENCE LIST (4) Luminescent Component
(1) solid material composition;
(11) First luminescent crystals
(14) Matrix, comprising P1 or SM1, and metal $M^3$, and optionally S1.
(3), (31), (32) Substrate
(5), (51), (52) Protecting layer According to a first aspect of the present invention, a luminescent component 4 is provided. The luminescent component 4 comprises a solid material composition 1 including luminescent crystals 11, embedded in a solid matrix 14. Said first luminescent crystals are of the perovskite crystal structure and emit light of a first wavelength in response to excitation, including excitation by light with a wavelength shorter than the first wavelength or excitation by an electrical current. Said solid matrix 14 comprises polymer P1 or small molecules SM1 as a matrix material and a metal $M^3$ distributed within said matrix material and optionally a surfactant S1. Such luminescent component is suitable for use in light emitting devices. Particularly, it exhibits excellent optical properties ab initio and maintains high optical performance after accelerated degradation. This aspect of the invention shall be explained in further detail below:

Metal $M^3$: The metal $M^3$ may be selected from a broad range of metals, advantageously from metals different than $M^1$ and different from $M^2$ (both as defined below).

In an embodiment, $M^3$ is selected from the group of metals having stable oxidation state +2, +3 or +4, preferably consisting of Mg, Sr, Ba, Sc, Y, Zn, Cd, In, and Sb. Preferably, $M^3$ is selected from Zn and Cd, particularly preferably Zn. In an advantageous embodiment, $M^3$ represents Zn and $M^2$ represents Pb.

The amount of $M^3$ may vary over a broad range and depends on the concentration of perovskites (I). Suitable are, for example $0.3:1 < M^3:M^2 < 20:1$.

Within solid material composition 1, metal $M^3$ is typically present in ionic form or complexed form. This includes metals in positive oxidation state, such as free ions [e.g. $Zn^{2+}$] or complex ions [e.g. $Zn^{2+}$ (Oleate$^-$)$_2$], or clusters of e.g. metal halide. The corresponding anion Y may be chosen from a broad range of anions, depending on the starting materials available and manufacturing conditions. Suitable anions Y are halides, pseudohalides, sulphide, carboxylates with 4-20 carbon atoms and chelating anions. Particularly suitable anions Y are halides and carboxylates with 4-20 carbon atoms. Such anions Y are known in the field.

Chelating anions Y are known in the field and include inorganic or organic anions being able to form two or more separate coordinate bonds to a single central metal cation. By way of example, suitable chelating anions Y include EDTA, while $F_3CSO_3^-$ is not a chelating anion.

Complexing ligands are also known in the field and include alkylamines and alkenylamines.

Specific examples for $M^3$ containing compounds include Zn halides, Cd halides, Zn oleate, Cd oleate and organic complexes such as $Zn^{2+}$ complexed with an alkylamine or alkenylamine.

$M^3$ is typically homogenously distributed ("dissolved state") in matrix 14. As a consequence, the concentration of $M^3$ within the perovskite (I) is low, while the concentration in the matrix 14 is high. Conversely, the concentration of $M^2$ within the perovskite (I) is high, while the concentration in the matrix 14 is low.

In embodiments, the molar ratio of $M^3:M^2$ inside an individual luminescent crystal is <0.5:1, preferably <0.25:1, preferably <0.1:1, preferably <0.05:1, most preferably <0.01:1 as determined by TEM-EDX.

In embodiments, the ratio of $M^3$ in the solid matrix material $14:M^2$ in the solid material composition 1 is between 0.3:1 and 20:1.

In embodiments, the $M^2$ content in the solid matrix material (14) is below 1000 ppm, preferably below 500 ppm, preferably below 250 ppm, preferably below 100 ppm, most preferably below 50 ppm, as determined by TEM-EDX or SEM-EDX or XPS.

In embodiments, the molar ratio of $X:M^2$ in said solid material composition is above than 4:1, as determined by TEM-EDX, SEM-EDX or ICP-MS.

First luminescent crystals 11: Suitable first luminescent crystals 11 are of the perovskite structure. Advantageously, the first luminescent crystals are selected from compounds of formula (I):

$$[M^1A^1]_a M^2{}_b X_c \qquad (I)$$

wherein
A¹ represents one or more organic cations, preferably selected from the group consisting of formamidinium, ammonium, guanidinium, protonated thiourea, imidazolium, pyridinium, pyrrolidinium;
M¹ represents one or more alkaline metals, preferably selected from Cs, Rb, K, Na, Li;
M² represents one or more metals other than M¹, preferably selected from the group consisting of Ge, Sn, Pb, and Bi;
X represents one or more anions selected from the group consisting of halides and pseudohalides and sulfide;
a represents 1-4, preferably 1;
b represents 1-2, preferably 1;
c represents 3-9, preferably 3;
wherein either M¹ or A¹ or M¹ and A¹ being present. Such compounds of formula (I) are known per se and described in WO2018/028869, the content thereof being included by reference.

The term Perovskite crystals of formula (I) includes both, coated ("encapsulated") perovskite crystals and non-coated perovskite crystals. As described in further detail below, it was found that encapsulation/coating of perovskites is no longer necessary while still retaining high performance of luminescent crystals. Accordingly, in embodiments, the invention relates to luminescent components as described herein comprising non-coated perovskite crystals of formula (I).

The compounds of formula (I) include stoichiometric and non-stoichiometric compounds. Compounds of formula (I) are stoichiometric, in case a, b and c represent a natural number (i.e. positive integers); they are non-stoichiometric, in case a, b and c represent a rational number, excluding natural numbers.

In one embodiment, organic cations A¹ are present in a compound of formula (I), while metallic cations M¹ are not present (A¹≠0; M¹=0; "organic cation perovskites", or simply "organic perovskites"). In one embodiment, organic cations A¹ are not present in a compound of formula (I), while metallic cations M¹ are present (A¹=0; M¹≠0; "inorganic cation perovskites", or simply "inorganic perovskites"). In one embodiment, organic cations A¹ and metallic cations M¹ are present (A¹≠0; M¹≠0, "hybrid cation perovskites", or simply "hybrid perovskites").

Suitable organic cations A¹ may be selected from the group consisting of formamidinium cations (IV-1), ammonium cations (IV-2), guanidinium cations (IV-3), protonated thiourea cations (IV-4), imidazolium cations (IV-5), pyridinium cations (IV-6), pyrrolidinium cations (IV-7),

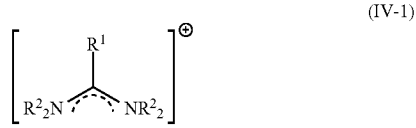
(IV-1)

(IV-2)

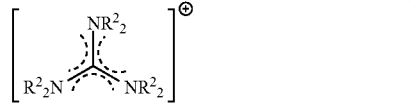
(IV-3)

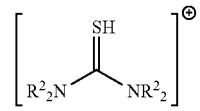
(IV-4)

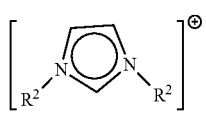
(IV-5)

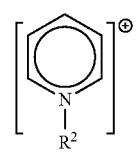
(IV-6)

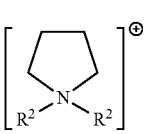
(IV-7)

wherein the substituents R represents, independent from each other, hydrogen, or C1-4 alkyl, or phenyl, or benzyl and in case R is connected to carbon it additionally represents independent from each other halide or pseudohalide. For (IV-1), R² preferably represents hydrogen; and R¹ preferably represents methyl or hydrogen or halide or pseudohalide. Preferred cations are selected from the group consisting of the acetamidinium, formamidinium (FA). FA is the preferred cation.

For (IV-2), R preferably represents hydrogen and methyl, ethyl, n-propyl, iso-propyl, n-butyl, iso-butyl, tert-butyl, phenyl, benzyl. Preferred cations are selected from the group consisting of benzylammonium, iso-butylammonium, n-butylammonium, t-butylammonium, diethylammonium, dimethylammonium, ethylammonium, methylammonium (MA), phenethylammonium, iso-propylammonium, n-propylammonium. MA is the preferred cation.

For (IV-3), R² preferably represents hydrogen, resulting in the parent compound, the guanidinium cation.

For (IV-4), R² preferably represents hydrogen, resulting in the parent compound, the protonated thiourea cation.

For (IV-5), R² preferably represents methyl or hydrogen. Imidazolium is the preferred cation.

For (IV-6), R² preferably represents methyl or hydrogen. Pyridinium is the preferred cation.

For (IV-7), R² preferably represents methyl or hydrogen. Pyrrolidinium is the preferred cation.

In one embodiment, the invention relates to LCs of formula (I), where A'=FA.

In one embodiment, the invention relates to LCs of formula (I), where M¹=Cs.

In one embodiment, the invention relates to LCs of formula (I), where M²=Pb.

In one embodiment, the invention relates to LCs of formula (I), where X is selected from the group consisting of chloride, bromide, iodide, cyanide, thiocyanate, isothiocyanate and sulfide. In a preferred embodiment, the invention relates to LCs of formula (I), where X is selected from the group consisting of Cl, Br, and I. In one embodiment, the invention relates to LCs/QDs of formula (I), where X represents a single element selected from the list of Cl, Br, and I. In one alternative embodiment, the invention relates to LCs of formula (I), where X is a combination of at least two elements selected from the list of Cl, Br, I.

In one embodiment, the invention relates to LCs of formula (I), selected from $FA_1Pb_1X_3$, particularly $FAPbBr_3$, $FAPbBr_2I$.

In one further embodiment, the invention relates to LCs of formula (I) further including dopants, i.e. wherein part of $M^1$ is replaced by other alkaline metals, or wherein part of $M^2$ is replaced by other transition metals or rare earth elements, or wherein part of X is replaced by other halogenides, or wherein part of $A^1$ is replaced by other cations as defined herein. Dopants (i.e. replacing ions), if present, account to less than 15% (n/n) in respect to the ion they are replacing.

The concentration of luminescent crystals 11 may vary over a broad range. Preferably, a concentration of the first luminescent crystals with respect to P1 is between 0.01 wt % and 20.0 wt %, preferably between 0.03 wt % and 7 wt %, most preferably between 0.05 wt % and 1.0 wt %.

Matrix 14: The matrix comprises at least two components, polymer P1 or Small Molecule SM1, and metal M3. Optionally, and also preferred, surfactant S1 is also present. These components do form a homogeneous phase and are discussed in detail below. Accordingly, M3 is homogeneously distributed in P1/SM1. M3 may be present in dissolved form and/or in the form of aggregates with particle size below 10 nm. Thus, M3 may be present in ionic form or in the form of clusters. The term "cluster" shall include particles with particle size below 10 nm, preferably below 3 nm, optionally surrounded or stabilized by surfactant S1. The term "ionic form" shall include metal ions and complexed metal ions. Without being bound to theory, it is believed that surfactant S1 supports dissolution of a metal salt comprising M3, thereby forming aggregates or dissolved ions. These forms may be in equilibrium.

In embodiments, the matrix is free of particulate material, specifically free of a metal salt comprising M3 with particles above 10 nm size.

The presence of metal $M^3$ in matrix 14 may be confirmed by known analytical methods, such as ICP-MS or LA-ICP-MS or TEM/SEM-EDX. The presence or absence of metal salt comprising M3 with particle size above 10 nm may be confirmed by TEM.

In embodiments, the matrix 14 comprises metal $M^3$, polymer P1 and surfactant S1, preferably the matrix 14 comprises metal $M^3$, polymer P1 and surfactant S1 but no Small Molecule SM1. In embodiments, the matrix 14 consists of metal $M^3$, first polymer P1 and surfactant S1.

In embodiments, the matrix 14 comprises metal $M^3$, small molecules SM1 and surfactant S1, preferably the matrix 14 comprises metal $M^3$, Small Molecule SM1 and surfactant S1 but no polymer P1. In embodiments, the matrix 14 consists of metal $M^3$, small molecules SM1 and surfactant S1.

Further materials: The matrix 14 may contain further materials. Such further materials include solvents, plasticizers, stabilizing agents, viscosity modifiers, catalysts (e.g. polymerization initiators), non-reacted monomers, antiplasticizers. Such further materials are known to the skilled person. The selection of type and amount thereof being routine work for the skilled person.

In a further embodiment the matrix 14 additionally comprises a plasticizer compound, e.g. for reducing the Tg. Such plasticizer compounds can be reactive (polymerizable) or non-reactive (not polymerizable). Reactive plasticizers include acrylic esters, such as e.g. lauryl-acrylate, stearyl-acrylate. Non-reactive plasticizers include esters such as e.g. Bis(2-ethylhexyl) phthalate.

In a further embodiment the matrix 14 additionally comprises an anti-plasticizer compound. Antiplasticizers are any small molecule or oligomer additives which, at certain concentrations, increase the Young's modulus while decreasing the glass transition temperature.

In a further embodiment the matrix 14 additionally comprises scattering particles selected from the group of organic and inorganic scattering particles. Materials for scattering particles comprise silicone (e.g. organopolysiloxanes), titania, zirconia, alumina, silica.

Polymer P1: The polymer P1 may be selected from a large variety of polymers as described herein. These may include organic polymers selected from the group of acrylate polymers, epoxy polymers, carbonate polymers, vinyl polymers, urethane polymers, ester polymers, styrene polymers, olefin polymers, cyclic olefin copolymers. In embodiments, these may include inorganic polymers selected from the group of silicone polymers or polysilazane polymers.

In embodiments of the invention the polymer P1 has a glass transition temperature $50°$ C.$<T_g<130°$ C., preferably $50°$ C.$<T_g<110°$ C., preferably $50°$ C.$<T_g<90°$ C., most preferably $50°$ C.$<T_g<70°$ C. Accordingly, P1 may be considered a "soft" polymer.

In embodiments of the invention the polymer P1 is transmissive to visible light with a transmittance of >70%, preferably >80%, most preferably >90% at a thickness of 100 µm and a wavelength of 500 nm.

In embodiments of the invention the polymer P1 is amorphous (not crystalline; not semi-crystalline).

In embodiments of the invention the polymer P1 is a cross-linked polymer. Crosslinking is the general term for the process of forming covalent bonds or relatively short sequences of chemical bonds to join two polymer chains together. Crosslinked polymers cannot be dissolved in a solvent without destroying covalent bonds by e.g. oxidation in an oxidizing solvent. However, crosslinked polymers might swell when subjected to a solvent. In the case of acrylates, crosslinking can be obtained for example by curing a mixture of at least 0.5 wt % difunctional and/or multi-functional acrylate pre-polymer with a monofunctional acrylate pre-polymer.

In embodiments of the invention the polymer P1 has a molar ratio of the sum of (oxygen+nitrogen+sulphur+phosphorous+fluorine+chlorine+bromine+iodine) to carbon <0.9, preferably <0.4, preferably <0.3, most preferably <0.25.

In embodiments of the invention the polymer P1 has a water vapour transmission rate (WVTR) expressed in (g*mm)/(m2*day) at a temperature/relative humidity of 40° C./90% r.h. of WVTR<1 (g*mm)/(m2*day), preferably <0.5 (g*mm)/(m2*day), most preferably <0.2 (g*mm)/(m2*day). In embodiments of the invention the polymer P1 has an oxygen transmission rate (OTR) expressed in $(cm^3*mm)/(m^2*day*atm)$ at a temperature/rel. humidity of 23° C./0% r.h. of OTR>1 $(cm^3*mm)/(m^2*day*atm)$, preferably >5, more preferably >25, most preferably >125 $(cm^3*mm)/(m^2*day*atm)$.

In embodiments of the invention the polymer P1 is selected from the group of acrylate polymers; preferably crosslinked acrylate polymers. Crosslinked acrylates are obtained for example by using a difunctional and/or multi-functional pre-polymer with at least 0.5 wt % in a monofunctional acrylate.

In one preferred embodiment of the invention the polymer P1 is an acrylate. Advantageously, the first polymer contains (ie. comprises or consists of) repeating units of monofunctional acrylates (III) and repeating units of multi-functional acrylates (V). As the term implies, monofunctional acrylates comprise one acrylate functionality while multifunctional acrylates comprise 2, 3, 4, 5 or 6 acrylate functionalities. As used herein, the term acrylates also includes (Meth)acrylates. The amount of monofunctional acrylate repeating units (III) and multifunctional acrylate repeating units (V) may vary over a broad range. Suitable are, for example, first polymers comprising 10-90 wt %, preferably 50-80 wt %, monofunctional acrylate repeating units. Suitable are, for example, first polymers comprising 10-90 wt %, preferably 20-50 wt %, multifunctional acrylate repeating units.

In one preferred embodiment the repeating units comprise mono-functional acrylates of formula (III)

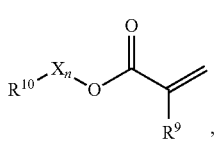
(III)

wherein:
$R^9$ represents H or $CH_3$,
$R^{10}$ represents a cyclic, linear or branched $C_{1-25}$ alkyl, or a $C_{6-26}$ aryl group, each optionally substituted with one or more cyclic, linear or branched $C_{1-20}$ alkyl, phenyl or phenoxy,
n represents 0 or 1, and
X represents a spacer from the group of alkoxylates comprising 1-8 carbon atoms and 1-4 oxygen atoms.

The term cyclic $C_{x-y}$ alkyl group shall include monocyclic and polycyclic groups, including fused ring systems comprising x-y carbon atoms as ring members. Cyclic alkyl groups x-y may also include groups with one double bond.

Compounds of formula (III) include acrylates of formulae (III-1) and (III-2) where $R^9$ is H, and Methacrylates of formula (III-3) and (III-4) where $R^9$ is Methyl, collectively also termed acrylates.

Further, compounds of formula (III) also include simple acrylates where n is 0 and X is not present, formulae (III-1) and (III-3):

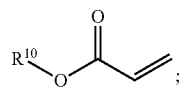
(III-1)

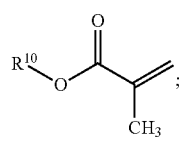
(III-3)

where $R^{10}$ is as defined above.
Further, compounds of formula (III) also include alkoxylated acrylates, formulae (III-2) and (III-4):

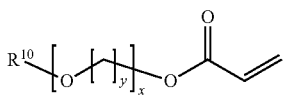
(III-2)

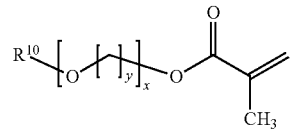
(III-4)

where $R^{10}$ is as defined above.
$R^{10}$ preferably represents a cyclic $C_{5-25}$ alkyl, an acyclic (linear or branched) $C_{1-25}$ alkyl, or a $C_{6-26}$ aryl, each optionally substituted with one or more cyclic, linear or branched $C_{1-20}$ alkyl, phenyl or phenoxy,
$R^{10}$ more preferably represents a saturated cyclic $C_{5-25}$ alkyl group, whereby cyclic alkyl includes mono-cyclic and poly-cyclic groups optionally substituted by 1-6 substituents, each substituent independently selected from $C_{1-4}$ alkyl.
$R^{10}$ most preferably represents a saturated poly-cyclic $C_{6-25}$ alkyl group, substituted by 1-6 substituents, each substituent independently selected from $C_{1-4}$ alkyl.
$R^{10}$ further most preferably represents a saturated poly-cyclic $C_{8-25}$ alkyl group optionally comprising 1-6 substituents, each substituent independently selected from $C_{1-4}$ alkyl.

Specific examples of $R^{10}$ include isobornyl, dicyclopentanyl, 3,3,5-trimethyl cyclohexyl, 4-tert-butylcyclohexyl acrylate.

Specific examples of acrylates of formula (III-1) and (III-3) include: isobornylacrylate (CAS 5888-33-5), isobornylmethacrylate (CAS 7534-94-3), dicyclopentanyl-acrylate (CAS 79637-74-4, FA-513AS (Hitachi Chemical, Japan)), dicyclopentanyl-methacrylate (CAS 34759-34-7, FA-513M (Hitachi Chemical, Japan)), 3,3,5-trimethyl cyclohexyl acrylate (CAS 86178-38-3), 3,3,5-trimethyl cyclohexyl methacrylate (CAS 7779-31-9), 4-tert-butylcyclohexyl acrylate (CAS 84100-23-2), 4-tert-Butylcyclohexyl methacrylate (CAS 46729-07-1).

Specific examples of acrylates of formula (III-2) and (III-4) include: poly(ethylene glycol) phenyl ether acrylates (specifically 2-phenoxyethyl acrylate), O-phenyl phenoxyethyl acrylate, Polyethylene glycol o-phenylphenyl ether acrylate (CAS 72009-86-0), poly(ethylene glycol) ethyl ether methacrylate, Di(ethylene glycol) ethyl ether acrylate, Poly(ethylene oxide) nonylphenyl etheracrylate, Poly(propylene glycol) 4-nonylphenyl ether acrylate, Ethylene glycol dicyclopentenyl ether acrylate, Ethylene glycol dicyclopentenyl ether methacrylate.

In one preferred embodiment the multifunctional units comprise di-functional acrylates of formula (V)

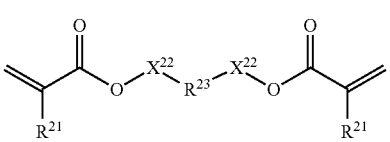
(V)

wherein
$R^{21}$ independently from each other represent H or $CH_3$;
$R^{23}$ represents a cyclic, linear or branched $C_{1-25}$ alkyl, or a $C_{6-26}$ aryl group, each optionally substituted with one or more cyclic, linear or branched $C_{1-20}$ alkyl, phenyl or phenoxy;
$X^{22}$ independently from each other represent a spacer selected from the group of alkoxylates, whereby both substituents $X^{22}$ together comprise 8-40 carbon atoms and 2-20 oxygen atoms.

R²³ preferably represents a C₆₋₂₆ aryl group optionally substituted with one or more cyclic, linear or branched C₁₋₂₀ alkyl, phenyl or phenoxy.

R²³ particularly preferably represents a C₆₋₂₆ aryl group, optionally substituted with one or more cyclic, linear or branched C₁₋₂₀ alkyl. Aryl includes mono-cyclic and poly-cyclic aryls which may optionally be substituted by 1-4 substituents, said substituents being selected from the group of C₁₋₄ alkyl, phenyl and phenoxy.

R²³ particularly preferably represents phenyl, benzyl, 2-naphtyl, 1-naphtyl, 9-fluorenyl.

R²³ most preferably represents bisphenol A or fluorene-9-bisphenol.

X²² preferably represents a spacer selected from the group of ethoxylates and/or isopropoxylates whereby both substituents X²² together comprise 8-24 carbon atoms and 4-8 oxygen atoms.

X²² most preferably represents a spacer selected from the group of ethoxylates and/or isopropoxylates whereby both substituents X²² together comprise 4-20 carbon atoms and 2-10 oxygen atoms.

A preferred group of diacrylates are of formula (V-1)

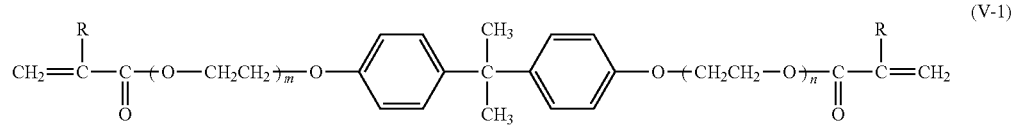

(V-1)

wherein R represents H or CH₃ and m+n is between 4 and 10.

Specific examples of di-functional acrylates include 1,10-decanediol diacrylate, 1,6-hexanediol diacrylate, 1,6-hexanediol dimethacrylate, Neopentyl glycol dimethacrylate, tricyclodecane dimethanol diacrylate, Bisphenol A ethoxylate diacrylate (including CAS 64401-02-1, such as Miramer M240 (Miwon Korea), Miramer M2100 (Miwon Korea), Fancryl FA-324A (Hitachi Chemical, Japan), Fancryl FA-326A (Hitachi Chemical, Japan), Fancryl FA-328A (Hitachi Chemical, Japan), Fancryl FA-321A (Hitachi Chemical, Japan)). Bisphenol A ethoxylate dimethacrylate (such as Miramer M241 (Miwon Korea), Miramer M2101 (Miwon Korea), Fancryl FA-324M (Hitachi Chemical, Japan), Fancryl FA-326M (Hitachi Chemical, Japan), Fancryl FA-328M (Hitachi Chemical, Japan) Fancryl FA-321M (Hitachi Chemical, Japan)), modified fluorene-9-bisphenol diacrylate (CAS, modified fluorine-9-bisphenol dimethacrylate.

Specific examples of trifunctional acrylates include ethoxylated trimethylolpropane triacrylate (CAS28961-43-5), isopropoxylated trimethylolpropane triacrylate (CAS53879-54-isopropoxylated glycerine triacrylate (CAS52408-84-1).

Specific examples of tetrafunctional acrylates include Di(trimethylolpropane) tetraacrylate (CAS94108-97-1), ethoxylated pentaerythritol tetraacrylate (CAS51728-26-8).

Specific examples of pentafunctional acrylates include Dipentaeritritol pentaacrylate (CAS 60506-81-2).

Specific examples of hexafunctional acrylates include Dipentaerythritol hexaacrylate (CAS 29570-58-9).

Small molecule: In embodiments, matrix 1 is devoid of polymer P1. In such embodiment, the matrix material comprises small molecules (SM1). Said small molecules (SM1) are commercial items and may be selected from a large variety of organic compounds including non-conducting (isolating) organic compounds and semiconducting organic molecules. Advantageously, small molecules SM1 are between 90≤Mr≤2000 g/mol.

Suitable small molecules SM1 may be selected from the group of non-conducting organic compounds, such as organic surfactants [e.g. as discussed herein for S1], or nonfunctional organic molecules. In embodiments, the matrix 14 is devoid of polymer P1. In such embodiment, the surfactant S1 as discussed herein forms the matrix. This embodiment is particularly suitable in the context of pixels, specifically where the perovskite (I) is excited by light, e.g. blue light.

Suitable small molecules may be selected from the group of semiconducting organic molecules, such as molecules used as host matrices, charge transport or charge injection layers in organic light emitting diodes or quantum dot light emitting diodes. Exemplary embodiments of such molecules are carbazole derivatives, fluoren derivatives, Triphenylphosphineoxide derivatives and include as specific examples DPEPO, mCPb, PRO7, 26mCPY, PzCz, TPSi-F and 3TPAPFP. In embodiments, the matrix 14 is devoid of polymer P1. In such embodiment, the semiconducting organic molecules as discussed herein forms the matrix. This embodiment is particularly suitable in the context of pixels, specifically where the peroviskite (I) is excited by a current.

Surfactant (ligand): Typically, the matrix comprises—in addition to the hardened/cured polymer P1 or the Small Molecule SM1 and the metal M³—one or more surfactants S1. A broad range of surfactants may be used. Suitable surfactants may be determined in routine experiments; its choice depends mainly on the polymer P1, the perovskite of formula (I) and the metal M³.

Suitable surfactants may be selected from the group consisting of non-ionic, anionic, cationic and zwitter-ionic surfactants; preferably selected from the group of zwitter-ionic surfactants.

In an embodiment the surfactant comprises a primary, secondary, tertiary or quaternary amine or ammonium group, e.g. from the class of alkenylamines and alkylamines.

In an embodiment the surfactant is a zwitter-ionic surfactant, e.g. from the class of sulfobetaines and phosphocholines.

It is known in the art to combine two or more surfactants to improve positive properties; such combination of surfactants being also subject to the present invention. In an embodiment, the surfactants comprise a mixture of a zwitter-ionic surfactant and a non-ionic surfactant.

Luminescent Component: It is preferred that component 4 does not spontaneously emit light of a wavelength but does so in response to an excitation, such as (i) in response to an excitation by electrical current or (ii) in response to an excitation with light of a wavelength shorter than the wavelength of the light to be emitted in response to the excitation. Hence, in a preferred embodiment, the component 4 emits light of a first wavelength, e.g. light in the green spectrum, in response to an excitation with light of a second, and shorter, wavelength, e.g. light in the blue spectrum. Alternatively, component 4 emits light of a first wavelength, e.g. light in the green spectrum, in response to an excitation by electrical current.

Also provided is the use of a luminescent component 4, for emitting white light in response to the luminescent component 4 being radiated by blue light, in particular as a backlight in a liquid crystal display.

In one embodiment, the luminescent component may have the shape of a film, i.e. with a length and width exceeding a thickness of the luminescent component, and preferably exceeding the thickness at least ten times. The thickness of this film or layer may vary over a broad range, but typically is 1-500 microns.

In one embodiment, the luminescent component may have the shape of a pixel. The term pixel is known in the context of display devices and denotes the smallest addressable element in an all points addressable display device. A pixel is considered the smallest controllable element of a picture represented on the screen. Accordingly, the invention also provides for a pixel comprising the luminescent component 4 described herein.

Further Elements: The luminescent component 4 may comprise further elements, such as protecting layers 5, and/or substrates 3.

Protecting layers 5, 51, 52: One option of protecting layers are barrier layers. The luminescent component 4 optionally comprises one or more barrier layers 5. Such barrier layers are located on top of an otherwise exposed surface of the luminescent component. In a preferred embodiment, barrier films may be attached to both sides of the luminescent component in case of a rectangular, sheet-like luminescent component.

Such protecting layers (e.g. barrier films) are known in the field; typically comprising a material/a combination of materials with low water vapour transmission rate (WVTR) and/or low oxygen transmission rate (OTR). By selecting such materials, the degradation of the LCs in the component in response to being exposed to water vapor and/or oxygen is reduced or even avoided. Barrier layers or films preferably have a WVTR<10 (g)/(m^2*day) at a temperature of 40° C./90% r.h. and atmospheric pressure, more preferably less than 1 (g)/(m^2*day), and most preferably less than 0.1 (g)/(m^2*day).

In one embodiment, the barrier film may be permeable for oxygen. In an alternative embodiment, the barrier film is impermeable for oxygen and has an OTR (oxygen transmission rate)<10 (mL)/(m^2*day) at a temperature of 23° C./90% r.h. and atmospheric pressure, more preferably <1 (mL)/(m^2*day), most preferably <0.1 (mL)/(m^2*day). In one embodiment, the barrier film is transmissive for light, i.e. transmittance visible light >80%, preferably >85%, most preferably >90%.

Suitable barrier films may be present in the form of a single layer 5. Such barrier films are known in the field and contain glass, ceramics, metal oxides and polymers. Suitable polymers may be selected from the group consisting of polyvinylidene chlorides (PVdC), cyclic olefin copolymer (COC), ethylene vinyl alcohol (EVOH), high-density polyethylene (HDPE), and polypropylene (PP); suitable inorganic materials may be selected from the group consisting of metal oxides, $SiO_x$, $Si_xN_y$, $AlO_x$. Most preferably, a polymer humidity barrier material contains a material selected from the group of PVdC and COC.

Most preferably a polymer oxygen barrier material contains a material selected from EVOH polymers.

Suitable barrier films may be present in the form of multilayers 51, 52. Such barrier films are known in the field and generally comprise a substrate, such as PET with a thickness in the range of 10-200 μm, and a thin inorganic layer comprising materials from the group of $SiO_x$ and $AlO_x$ or an organic layer based on liquid crystals which are embedded in a polymer matrix or an organic layer with a polymer having the desired barrier properties. Possible polymers for such organic layers comprise for example PVdC, COC, EVOH.

Substrate 3, 31, 32: The luminescent component 4 optionally comprises a substrate 3. Such substrates are known in the field and include flat substrates (FIGS. 1D, 2A) particularly suited for films (as outlined below) and structured substrates (FIG. 2B) particularly suited for pixels (as outlined below).

INDUSTRIAL APPLICABILITY

Inventive components 4 show good stability. Embodiments of the present components 4 show improved stability towards humidity at e.g. 60° C./90% r.h.

Embodiments of the present components 4 show a quantum yield >60%, and preferably >80%, most preferably >90%, preferably when excited by blue light. In addition, owed to the material selection, the crystal size, and the strict covering of first LCs, sharp wavelength distributions can be achieved in the emitted light, such that the quality of the resulting emitted light is superior. Preferably, the FWHM (Full Width at Half Maximum) of the solid material composition of each of the elements for visible emissions is <50 nm, preferably, <40 nm, and most preferably <30 nm. For example, an FWMH for the emission peak at 525 nm of 23 nm can be observed, at the same time measuring a high luminescence quantum yield of the component.

Embodiments of the present components 4 comply with RoHS ("Restriction of Hazardous Substances") Directive by the European Union.

According to a second aspect of the present invention, self-supporting films and light emitting devices, comprising the luminescent component 4, are provided. The self-supporting films, and the luminescent components respectively, are useful as an intermediate good that is assembled together with other components into a light emitting device, such as a display or lighting device. Accordingly, a light emitting device comprises a luminescent component according to any of the preceding embodiments and a light source for emitting light (i.e. wavelength in a range between 400 and 490 nm).

The light source is arranged for exciting the luminescent component and preferably emits blue light. Accordingly, the light source is in optical communication with the luminescent component. Accordingly, the device is configured to emit light of wavelengths which are defined by the luminescent crystals 11 of the luminescent component 4.

In such light emitting devices, the luminescent component may be present in various architectures, including films (c.f. FIG. 1), pixels (c.f. FIG. 2). Such architectures are known in the field. It is considered beneficial that the inventive luminescent component 4 is compatible with known architectures.

Self supporting film: Luminescent self-supporting films comprising a luminescent layer and optionally one or more additional layers are known in the field. However, films comprising the component 4 as described herein and optionally further layers are not yet known. Such films are illustrated in FIG. 1 and may comprise one or more barrier layers and/or a substrate.

In embodiments, the invention provides for self-supporting films consisting of the solid material composition 1 as defined herein.

In embodiments, the invention provides for self-supporting films comprising, preferably consisting of, the solid material composition 1 and one or more barrier layers 5, 51, 52 as described herein.

In embodiments, the invention provides for self-supporting films comprising, preferably consisting of, a substrate 3 arranged on a first side of the solid material composition. In embodiments, the invention provides for self-supporting films comprising, preferably consisting of, a substrate 3 arranged on a first side of the solid material composition 1 and a barrier layer 5, 51, 52 arranged on a second side opposite to the first side of the composition.

Pixel: In one embodiment, the luminescent component 4 may be comprised in a pixel. Such pixels are illustrated in FIG. 2. In embodiments, the luminescent component in the pixel is adapted to be excited by an electrical current. Thus, electrodes (not shown in FIG. 2) may be in contact with the luminescent component 4. In a further embodiment, the luminescent component in the pixel is adapted to be excited by light. Thus, a light source (not shown in FIG. 2) may be in optical communication with the luminescent component 4.

Light emitting devices: Light emitting devices comprising a luminescent layer and optionally one or more additional layers are known in the field. However, light emitting devices comprising the component 4, or a self-supporting film as described herein, or at least one pixel as described herein, are not yet known.

In one embodiment, the invention provides for a light emitting device, comprising a luminescent component as described herein, or a self-supporting film as described herein, or at least one pixel as described herein, and a light source, wherein the light source is arranged for exciting the luminescent component 4 or the self-supporting film or the at least one pixel. Advantageously, the light source is adapted to emit blue light.

In further embodiments, the invention provides for a light emitting device, comprising a luminescent component as described herein or at least one pixel as described herein and at least two electrodes wherein the electrodes are adapted to excite the luminescent component (4) or the pixels by an electrical current.

In embodiments of the invention, the light emitting device described herein is selected from the group consisting of displays, particularly liquid crystal displays, OLED displays, QLED displays (electroluminescent), LED displays and micro LED displays. In embodiments of the invention, the light emitting device described herein is selected from lighting devices, particularly LEDs. Thus, as part of an LCD, OLED, LED or micro LED, the component 4 may contribute to such display (e.g. of a mobile or stationary computing, telecommunication, or television device) or to such lighting device.

In yet another embodiment of this invention the light source is an OLED stack. In this case, the luminescent component is preferably arranged to cover the whole OLED stack or at least parts of it.

Scattering Particles: In one embodiment, the solid material composition of the luminescent component 4, contains scattering particles in an amount between 0.1-30 wt %.

According to a third aspect of the present invention, liquid compositions ("inks") are provided. These inks are particularly suited for the manufacturing of luminescent components 4 as described herein. By providing such inks, it is possible to manufacture luminescent components 4 by methods known in the field, particularly by solution-processing.

The invention thus also relates to a liquid composition comprising luminescent crystals of formula (I), $[M^1 A^1]_a M^2{}_b X_c$ (I), as defined herein, particularly first aspect of the invention; a liquid; optionally one or more surfactants S1; and further a metal M3, whereby $M^3$ as defined herein, particularly first aspect of the invention and whereby the molar ratio $M^3:M^2$ is as defined herein, particularly first aspect of the invention.

Liquid: Depending on the materials used and the intended use, the liquid may be selected by the skilled person.

In embodiments of the invention, the liquid comprises or consists of an organic solvent or a mixture of organic solvents.

In embodiments of the invention, the liquid comprises or consists of monomers of a first polymer P1 but no organic solvent.

In embodiments of the invention, the liquid comprises or consists of organic solvent and monomers of a first polymer P1.

In embodiments of the invention, the liquid comprises or consists of organic solvent and small molecules SM1 devoid of monomers of a polymer P1 and devoid of polymer P1.

Metal $M^3$: The metal $M^3$ is discussed above in the context of matrix material 14 [first aspect of the invention] and is likewise applicable to the inks [third aspect of the invention]. Advantageously, $M^3$ is present in ionic or complexed form, such as in the form of a halide or C4-C20 organic salt or in the form of a complex. Suitable are, for example Zn or Cd salts such as Zn or Cd halides; or for example organic salts such as Zn oleate or Cd oleate;

or for example organic complexes such as Zn2+ complexed with an alkylamine or alkenylamine.

In embodiments, the invention provides for an ink as described herein where $M^3$ is Zn and $M^2$ is Pb.

In embodiments, the invention provides for an ink as described herein where $M^3$ is Cd and $M^2$ is Pb.

According to a 4$^{th}$ aspect of the present invention, methods for manufacturing liquid compositions, luminescent components and light emitting devices are provided. Such manufacturing follows known methods for preparing inks, components (including films or pixels) and devices.

Ink Manufacturing

Known methods may be applied to the respective starting materials. A suitable method for preparing an ink as described herein comprises the steps of:
(a) preparing and providing a suspension comprising luminescent crystals of formula (I), a diluent, optionally surfactant; and
(b) preparing and providing a solution comprising $M^3$, preferably in the form of a salt or complex, a solvent, a surfactant; and
(c) combining the suspension of (a) and the solution of (b) to obtain a modified suspension; and
(d) optionally adding monomer adapted to form a polymer P1, or small molecules SM1, and
(e) optionally removing solvent,
to thereby obtain said liquid composition.

The individual steps (a) to (e) are conventional in the field and may be performed using standard equipment.

The starting materials are commercial items or obtainable according to known methods The definition of the starting materials, including LCs of formula (I), diluent, surfactant Metal M3, solvent, monomer and polymer P1, Small Molecule SM1, is given in this specification. These materials may be used as supplied. LCs of formula (I) may be prepared by ball milling, as known in the field and the starting materials are preferably having a low water content.

Step (a) may be performed by combining a pre-concentrate comprising luminescent crystals 11 with a composition comprising monomers or oligomers of the first polymer P1 or Small Molecules SM1. Such pre-concentrate preferably comprising further materials selected from the class of surfactants, dispersants, ligands.

Manufacturing of Luminescent Component

Known methods may be applied to convert an ink as described herein into a luminescent component containing (i.e. comprising or consisting of) a solid material composition 1. Broadly speaking, an ink as defined herein is subjected to a solution processing step, for example coating and printing technologies), followed by polymerization/curing and/or solvent removal. It is considered advantageous that known manufacturing equipment can be used to prepare the luminescent components of this invention.

A suitable method for preparing a luminescent component, comprising polymer P1 comprises the steps of:

(x) providing a substrate and an ink as described herein which comprises monomers of polymer (P1) and optionally solvent; and
(y) applying said ink to said substrate 3, optionally removing solvent; and
(z) curing the thus obtained composition to obtain the luminescent component 4.

A suitable method for preparing a luminescent component, comprising either small molecule SM1 or a polymer P1 comprises the steps of:

(aa) providing a substrate and a liquid composition as described herein, the composition comprising solvent and small molecule SM1 or Polymer P1 and;
(bb) applying said liquid composition to said substrate and removing the solvent to obtain the luminescent component 4.

The individual steps, such as applying (including coating and printing steps), curing or polymerizing (e.g. radiation polymerization, thermal polymerization, catalytic polymerization), finishing (e.g. coating with further layers) are known per se, but not yet applied to the specific starting materials used herein.

In the above methods, the initial product obtained is a component 4 comprising the solid material composition 1 on a substrate 3. Depending on the further use, the substrate 3 may be removed, thereby obtaining a component 4 consisting of composition 1 (FIG. 1A). Alternatively, the substrate 3 may be replaced by, or complemented by, other functional layers, thereby obtaining a laminate (FIGS. 1B, 1C, 1D). These subsequent process steps are known in the field.

Step (aa) may be performed solvent-free. In such case, steps (aa) and (bb) are performed at elevated temperatures, above the melting point of SM1 or P1, and solvent removal is avoided.

Step (aa) may be performed in the presence of a solvent. In such case, steps (aa) and (bb) are performed at temperatures below the melting point of SM1 or P1, and solvent removal takes place, typically by heating above the boiling point of the solvent.

Steps (y) and (bb) are preferably coating steps continuously performed on a moving substrate. This is known as Roll-to-Roll (R2R) technology.

In embodiments, all manufacturing steps may be performed continuously. Accordingly, the invention also provides for a method for manufacturing a luminescent component as described herein, the method being adapted to a continuous R2R process.

Manufacturing of Light Emitting Device

The luminescent component may be further processed as known in the field, e.g. by arranging it in optical communication to a light source. These subsequent manufacturing steps are entirely conventional and result in light emitting devices as discussed herein.

EXAMPLES

To further illustrate the invention, the following examples are provided. These examples are provided with no intent to limit the scope of the invention. If not stated otherwise, all of the chemicals were purchased from Aldrich.

Examples 1-3: Synthesis of Luminescent Components According to the Invention
(Luminescent Component Comprising $FAPbBr_3$ and $M^3=Zn$ or $M^3=Cd$)

A) Ink Formation

Starting ink formation: Formamidinium lead tribromide ($FAPbBr_3$) was synthesized by milling $PbBr_2$ and FABr. Namely, 16 mmol $PbBr_2$ (5.87 g, 98% ABCR, Karlsruhe (DE)) and 16 mmol FABr (2.00 g, Greatcell Solar Materials, Queanbeyan, (AU)) were milled with Yttrium stabilized zirconia beads (5 mm diameter) for 6 h to obtain pure cubic $FAPbBr_3$, confirmed by XRD. The orange $FAPbBr_3$ powder was added to Oleylamine (80-90%, Acros Organics, Geel (BE)) (weight ratio $FAPbBr_3$:Oleylamine=100:15) and toluene (>99.5%, puriss, Sigma Aldrich). The final concentration of $FAPbBr_3$ was 3 wt %. The mixture was then dispersed by ball milling using yttrium stabilized zirconia beads with a diameter size of 200 μm at ambient conditions (if not otherwise defined, the atmospheric conditions for all experiments are: 35° C., 1 atm, in air) for a period of 1 h yielding an ink with green luminescence. The properties of the "starting ink" are listed in Table 1, where photoluminescent quantum yield (PLQY), emission peak position (PP) and full width at half maximum (FWHM) of the ink are measured with a spectrofluorimeter equipped with an integrating sphere (Quantaurus Absolute PL quantum yield measuring system C1134711, Hamamatsu). The inorganic solid content was determined thermogravimetrically after burning of the organics in an oven (350° C., 24 h) to be 1.4 wt %.

$M^3=Zn$ source material: Zinc bromide (ZnBr2, 1 g, 98% grade Sigma Aldrich) was first dried in a vacuum oven (80° C., 30 mbar, 16 h) and mixed at room temperature for 16 h in 8.7 g toluene with 0.3 g Oleylamine (80-90%, Acros Organics, Geel (BE)). The resulting mixture was centrifuged, and the solid content was determined thermogravimetrically after evaporating the solvent (135° C., 2 h) to be 7.5 wt % ZnBr2 plus Oleylamine.

$M^3=Cd$ source material: Cadmium bromide (CdBr2, 2 g, 98% grade Alfa Aesar) was mixed at room temperature for 16 h in 17.5 g toluene with 0.5 g Oleylamine (80-90%, Acros Organics, Geel (BE)). The resulting mixture was centrifuged, and the solid content was determined thermogravimetrically after evaporating the solvent (135° C., 2 h) to be 5.2 wt % CdBr2 plus Oleylamine.

Final Ink Formation (Inventive Inks):

In a first experiment, 4.25 g "starting ink" as described above was mixed with 0.75 g "$M^3=Zn$ source material" as described above and stirred at room temperature for 16 h.

In a second experiment, 12.0 g "starting ink" as described above was mixed with 4.0 g "$M^3$=Cd source material" as described above and stirred at room temperature for 16 h Both inks still showed green emission.

B) Film Formation:

For the first film (Ex. 1, comparative) 0.022 g of the "starting ink" was mixed with an UV curable monomer/crosslinker mixture (0.35 g FA-513AS, Hitachi Chemical, Japan/0.15 g Miramer M240, Miwon, Korea) containing 1 wt % photoinitiator Diphenyl(2,4,6-trimethylbenzoyl) phosphine oxide (TCI Europe, Netherlands) in a speed mixer and the toluene was evaporated by vacuum (<0.01 mbar) at room temperature. The resulting mixture was cured between two glass slides (18×18 mm) with a thickness of approximately 100 μm for 60 s in UV (UVAcube100 equipped with a mercury lamp and quartz filter, Hoenle, Germany).

A second film (Ex. 2, inventive) was prepared as above with 0.045 g "final ink with $M^3$=Zn" instead of "starting ink".

A third film (Ex. 3, inventive) was prepared as above with 0.045 g "final ink with $M^3$=Cd" instead of "starting ink".

A series of forth films (Ex. 4.1-4.5, comparative) was prepared as above with 0.045 g "final ink with $M^3$=Li, Na, K, Rb, Cs" instead of "starting ink". This series of experiments was designed to show the effect of $M^3$=alkali metal $M^+$ (not inventive) compared to $M^3$=as defined in claim 1, $M^{2+}$ (inventive). As can be seen from table 2 below, alkali metal salts do not have a beneficial effect. In essence, the results after accelerated degradation are similar to example 1 (no salt in the matrix) and significantly inferior over the inventive compositions (salt $M^{2+}$ in the matrix). Specifically, PLQY of ex. 4 has a sharp drop and FWHM broadened after degradation testing.

C) Film Properties:

Table 2 shows the optical properties of the film as initially obtained and after degradation for 150 hours subjecting the samples to a high temperature/high humidity test (60° C./90% rH). The resulting optical properties of the film were measured with a spectrofluorimeter equipped with an integrating sphere (Quantaurus Absolute PL quantum yield measuring system C1134711, Hamamatsu).

TABLE 2

| Ex. #: (description) | test condition | PLQY (%) | Emission (nm) | FWHM (nm) | rel. ΔPLQY* |
|---|---|---|---|---|---|
| comparison | | | | | |
| 1: starting ink | initial | 94 | 525 | 22 | N/A** |
| | 150 h (60° C./90% rH) | 15 | 537 | 20 | −84% |
| 4: comparative ink $M^3$ = Alkali | initial | 72-90 | 521-525 | 22-25 | N/A** |
| | 150 h (60° C./90% rH) | 5-31 | 521-538 | 22-31 | −65%*** |
| inventive | | | | | |
| 2: final ink with $M^3$ = Zn | initial | 91 | 526 | 21 | N/A** |
| | 150 h (60° C./90% rH) | 93 | 526 | 22 | +3% |
| 3: final ink with $M^3$ = Cd | initial | 90 | 526 | 21 | N/A** |
| | 150 h (60° C./90% rH) | 82 | 528 | 26 | −9% |

*rel. ΔPLQY: relative change of PLQY compared to initial value
**N/A: not applicable
***or worse Analysis of molar ratio $M^3:M^2$: The molar ratio of the solid material composition (without the glass slides) of Example 2 (Zn:Pb) was determined to be 0.74:1 by ICP-MS.

D) Conclusion:

These results show that a luminescent component as described in this invention (Ex. 2 & 3) exhibits excellent initial properties and maintain high optical performance after accelerated degradation in 60° C./90% rH conditions. Ex. 1 shows inferior performance in terms of change in PLQY (from 94% to 15%=−84% relative change) and change in PP (from 525 nm to 537 nm=12 nm peak position shift) after 150 h under high temperature/high humidity, rendering this component unsuitable for application in displays or the like. To the contrary, the inventive films #2 and #3 comply with the requirements of applications in TVs and similar devices. Specifically, Ex. 2 and Ex. 3 show only minor change in PLQY of +3% for $M^3$=Zn and −9% for $M^3$=Cd and no to little change in PP (0 nm and 2 nm for $M^3$=Zn and $M^3$=Cd, respectively) after 150 h under high temperature/high humidity.

The invention claimed is:

1. A light emitting device comprising:
   a luminescent component and
   a light source for emitting blue light and arranged for exciting the luminescent component or at least two electrodes adapted to excite the luminescent component;
   the luminescent component comprising a solid material composition;
   said composition comprising a plurality of luminescent crystals embedded in a solid matrix;
   said luminescent crystals
      emit light of a first wavelength in response to excitation and
      are of the perovskite crystal structure of formula (I): $[M^1A^1]_a M^2_b X_c$ (I), wherein:
         $A^1$ represents one or more organic cations,
         $M^1$ represents one or more alkaline metals,
         $M^2$ represents one or more metals selected from the group of Ge, Sn, Pb, and Bi,
         X represents one or more anions selected from the group consisting of halides, pseudohalides and sulfide,
         a represents 1-4,
         b represents 1-2,
         C represents 3-9, and
         wherein either $M^1$, or $A^1$, or $M^1$ and $A^1$ being present; and
   said solid matrix comprising
   polymer or small molecules as a matrix material;
   a metal $M^3$ distributed within said matrix material, wherein $M^3$ is Zn, and wherein $M^3$ is present as free ion; or complex ion, or ionic clusters and a corresponding anion Y is chosen from halides, pseudohalides, sulphide, carboxylates with 4-20 carbon atoms and chelating anions; and
   at least one surfactant; and
   wherein the total molar ratio $M^3:M^2$ within said solid material composition is between 0.3:1 and 20:1 as determined by ICP-MS or ICP-OES.

2. The light emitting device according to claim 1, wherein $M^2$=Pb.

3. The light emitting device according to claim 1, wherein $M^1$ is not present in the perovskite crystal structure.

4. The light emitting device according to claim 1, wherein the molar ratio of $M^3: M^2$ inside an individual luminescent crystal is below 0.5:1 as determined by TEM-EDX.

5. The light emitting device according to claim 1, wherein $M^3$ is homogeneously distributed within said matrix material.

6. The light emitting device according to claim 1, wherein the ratio of $M^3$ in the solid matrix material: $M^2$ in the solid material composition is between 0.3:1 and 20:1, as determined by TEM-EDX and/or ICP-MS.

7. The light emitting device according to claim 1, wherein the $M^2$ content in the solid matrix material is below 1000 ppm, as determined by TEM-EDX.

8. The light emitting device according to claim 1, wherein the molar ratio of X: $M^2$ in said solid material composition is larger than 4:1, as determined by ICP-MS or ICP-OES.

9. The light emitting device according to claim 1 wherein the luminescent component is configured in sheet-like form, having a thickness of 1-500 microns, and a length exceeding a thickness at least ten times and a width exceeding a thickness at least ten times.

10. The light emitting device according to claim 1 wherein the luminescent component is configured as a self-supporting film and the light emitting device comprises at least two electrodes adapted to excite the self-supporting film.

11. The light emitting device according to claim 10, further comprising at least one barrier layer arranged on a surface of the self-supporting film.

12. The light emitting device according to claim 1, wherein the luminescent component comprises a pixel.

13. The light emitting device according to claim 12, wherein the light emitting device comprises a light source for emitting blue light and arranged for exciting the pixel.

14. The light emitting device according to claim 12, wherein the light emitting device comprises at least two electrodes adapted to excite the pixel.

15. The light emitting device according to claim 1 selected from the group consisting of lighting devices and displays.

16. The light emitting device according to claim 15, wherein the lighting device is LEDs.

17. The light emitting device according to claim 15, wherein the display is selected from liquid crystal displays, OLED displays, QLED displays, LED displays, and micro LED displays.

* * * * *